(12) United States Patent
Murphy

(10) Patent No.: US 9,208,941 B2
(45) Date of Patent: Dec. 8, 2015

(54) APPARATUS AND METHOD FOR SAFE STATE RETENTION

(76) Inventor: Steven Murphy, West Melbourne, FL (US)

(*) Notice: Subject to any disclaimer, the term of this patent is extended or adjusted under 35 U.S.C. 154(b) by 464 days.

(21) Appl. No.: 13/586,909

(22) Filed: Aug. 16, 2012

(65) Prior Publication Data

US 2014/0049262 A1    Feb. 20, 2014

(51) Int. Cl.
*G01R 31/06*  (2006.01)
*H01F 27/40*  (2006.01)
*H01F 29/14*  (2006.01)

(52) U.S. Cl.
CPC .............. *H01F 27/402* (2013.01); *H01F 29/14* (2013.01)

(58) Field of Classification Search
CPC ............ H01F 7/1607; H01F 2007/185; H01F 27/402; H01F 7/1844; H02K 41/03; H01H 47/325; G01R 31/06
See application file for complete search history.

(56) References Cited

U.S. PATENT DOCUMENTS 3,860,883 A * 1/1975 Bernin .......................... 330/279
6,208,497 B1 * 3/2001 Seale et al. .................... 361/160

* cited by examiner

*Primary Examiner* — Tung X Nguyen

(57) ABSTRACT

A transformer core apparatus includes a body of highly magnetically permeable material, a permanent magnet arranged in a safe state position for saturating the body with a permanent magnetic field, and means for removing the permanent magnetic field from the body.

20 Claims, 4 Drawing Sheets

APPARATUS AND METHOD FOR SAFE STATE RETENTION

BACKGROUND

1. Technical Field

Embodiments of the invention relate generally to power supplies. Particular embodiments relate to safe state retention in vital (fail-safe) power supplies.

2. Discussion of Art

Power supplies are electronic/electrical circuits that supply electric power to one or more electric loads. The term "power supply" is most commonly applied to devices that convert one form of electrical energy to another, and is used in that sense herein. For example, an AC power supply typically receives electrical power at input values of voltage, current, and frequency. The received electrical power excites a transformer, which then produces power at output values of voltage, current, and frequency.

A simple conventional power supply can include a transformer core, a primary winding, and a secondary winding that is electrically isolated from the primary winding. When current is supplied to the primary winding, the primary winding supplies a corresponding magnetic field to excite the transformer core. In case the primary winding is supplied with varying current, then the transformer core is excited by a varying magnetic field, which in turn excites a varying current in the secondary winding. In case of a failure condition in a load powered from the secondary winding, there is no provision to disable the transfer of power to the secondary winding from the primary winding.

Therefore, at least in safety-critical applications, it has generally been considered desirable to design power supplies as vital devices. "Vital" or fail-safe electronic/electrical circuits or devices are designed to isolate the device output from failures internal to the vital circuit or device. For example, many vital devices require input power for normal permissive operative. When input power is removed, for example in response to a circuit failure, a vital circuit assumes a "safe state" in which power cannot pass from the primary circuit to the secondary circuit. No single failure, or combination of latent failures and a single failure, may prevent the system from reaching the safe state. All combinations of possible failures must be considered.

A standard design practice for vital circuits is "safe state retention": once a vital system enters a safe state, it must remain in that safe state indefinitely. In order to remain in the safe state indefinitely, the system must be held in the state by some inherent (physical) properties that permanently block exiting the state once the system has entered that state.

In a known system, when a failure is detected, the system enables a short across its power input in order to blow a fuse, and thus, remove power to the system. Such systems are difficult to maintain and test. In another known system, primary circuit power is supplied through the contacts of a vital relay. On activation of a fault detect circuit, power is removed from the vital relay to establish a safe state. These systems are relatively large, expensive, and can only be tested by taking the system off line. In a third known solution, a system includes two processors that must cooperate to enable system operation. If either processor detects a problem, both processors attempt to overwrite their program memory, thereby permanently removing their ability to enable operation, at least until serviced by a technician. However, it is impossible to prove that a latent failure is not blocking a processor from overwriting the critical part of its memory, without actually overwriting the critical part of its memory. Moreover, this solution does not address failure cases where simply supplying voltage to an output (as by, for example, shorting past or through the processors) can cause an unsafe condition.

In view of the above, it is desirable to develop a vital power supply with safe state retention, which can be tested and reliably restored from test condition. It is even more desirable to develop a vital power supply with safe state retention, where the mode of safe state retention can be validated at the design stage, without endless or infeasible analysis of possible non-catastrophic electrical faults.

BRIEF DESCRIPTION

In one embodiment, a magnetically biased power supply apparatus includes a transformer core, a primary winding, a secondary winding, a permanent magnet, and a bias winding. The primary winding is arranged to supply, when energized, a varying primary magnetic field for exciting the transformer core. The secondary winding is electrically isolated from the primary winding and is arranged to be energized by the varying primary magnetic field in the transformer core. The permanent magnet is arranged in a first position to prevent excitation of the transformer core by saturating the transformer core with a permanent magnetic field. (Such a position is referred to herein as a "safe state" position.) The bias winding is connected to receive current from the secondary winding and is arranged to supply, while energized, a bias magnetic field for preventing saturation of the transformer core by the permanent magnetic field. Thus, loss of current from the secondary winding to the bias winding will cause restoration of the permanent magnetic field to saturate the transformer core.

In one aspect, a varying magnetic field in a transformer core induces a current in a secondary winding that is part of, and powers, a secondary circuit. On detection of a fault condition in the secondary circuit, a permanent magnetic field is permitted to saturate the transformer core, thereby preventing variation of the magnetic field in the transformer core.

In another embodiment, a reversibly saturated transformer core apparatus includes a body of highly magnetically permeable material, a permanent magnet arranged in a first, safe state position for saturating the body with a permanent magnetic field, and means for removing the permanent magnetic field from the body.

DRAWINGS

The present invention will be better understood from reading the following description of non-limiting embodiments, with reference to the attached drawings, wherein below:

DETAILED DESCRIPTION

Figure 1:
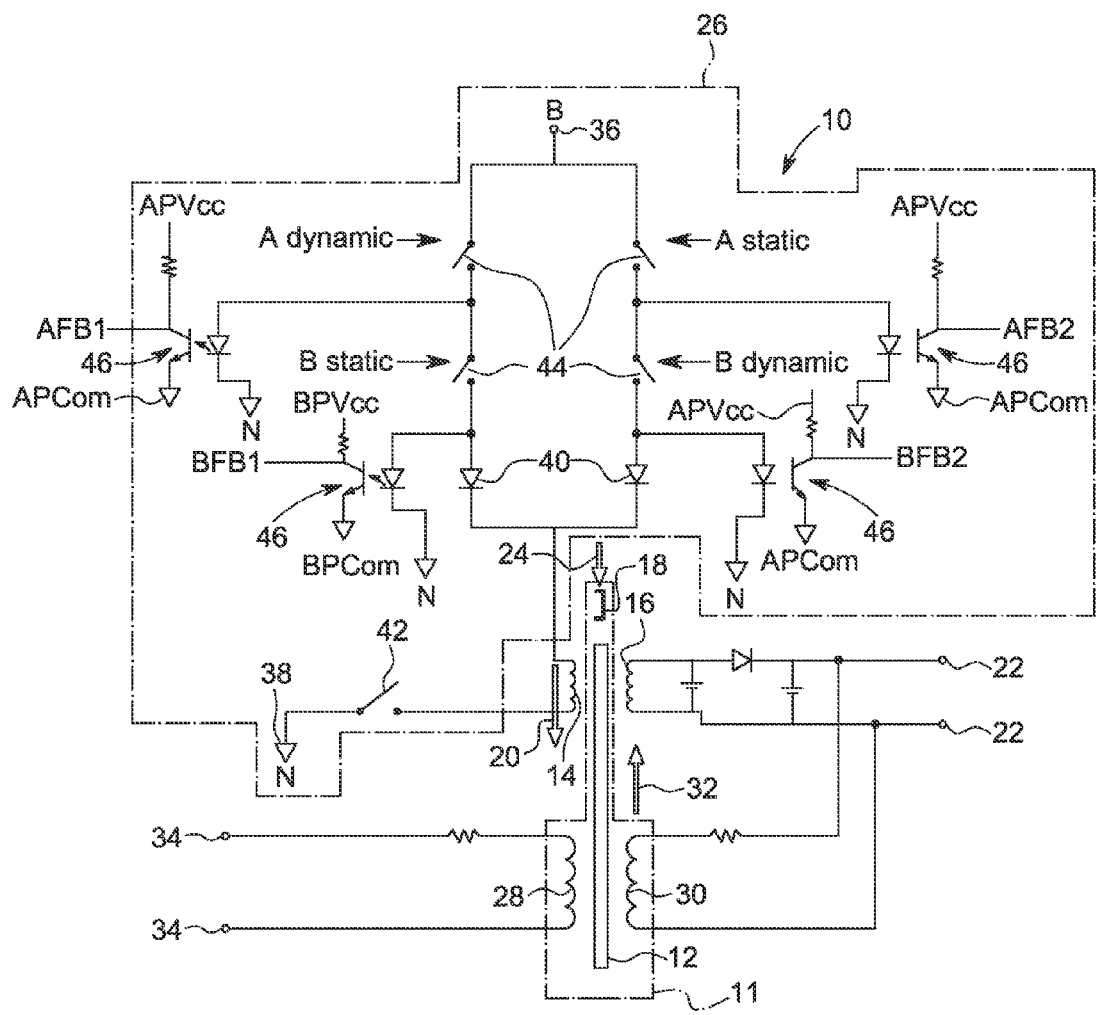
FIG. 1 illustrates in electronic schematic view a magnetically biased power supply with safe state retention, according to a first exemplary embodiment of the invention.

Reference will be made below in detail to exemplary embodiments of the invention, examples of which are illustrated in the accompanying drawings. Wherever possible, the same reference characters used throughout the drawings refer to the same or like parts. Although exemplary embodiments of the present invention are described with respect to a switched DC (direct current) power supply, embodiments of the invention also are applicable for use with transformer power supplies, generally.

Aspects of the invention relate to establishing a safe state in a power supply, by saturating a transformer core to prevent inductive transfer of power. Other aspects relate to a reversibly saturated transformer core apparatus.

In embodiments, a permanent magnet is provided to saturate a transformer core of a power supply with a permanent magnetic field. Means are provided for de-saturating the transformer core by canceling or removing the permanent magnetic field. The means are arranged such that external intervention is required for de-saturating the transformer core, in other words, so that the power supply cannot bootstrap itself. For example, one or more bias windings for canceling or removing the permanent magnetic field may be powered only from a source external to the power supply, or from a secondary winding of the power supply, such that, once the power supply is in a safe state (transformer core saturated), external intervention is required to exit the safe state. As another example, mechanical actuation of a key switch or similar operator interface may be required for canceling or removing the permanent magnetic field. Thus, safe state retention is achieved.

For example, FIG. 1 illustrates an electronic schematic of a magnetically biased power supply 10 implementing safe state retention via a reversibly saturated transformer core apparatus 11. The power supply 10 includes a transformer core 12, a primary winding 14, a secondary winding 16, and a permanent magnet 18. The transformer core 12 is formed of a body of material having relatively high magnetic permeability, i.e., a ferromagnetic material. (A material having relatively high magnetic permeability, or a body of highly magnetically permeable material, refers to materials that are suitably magnetically permeable to function as transformer cores for power transfer between windings associated with the core.) The primary winding 14 is arranged adjacent the transformer core 12 (e.g., at least part of the primary winding is wrapped around the core) for inducing a varying primary magnetic field 20 in the transformer core, while the secondary winding 16 is arranged adjacent the transformer core 12 (e.g., at least part of the secondary winding is wrapped around the core) for being excited by the transformer core. The secondary winding 16 is connected to supply current for energizing load terminals 22. The permanent magnet 18 is arranged in a first, safe state position for providing a permanent magnetic field 24 of a first polarity for saturating the transformer core 12, thereby preventing transfer of power from the primary winding 14 to the secondary winding 16 via the primary magnetic field 20.

The primary winding 14 can be connected to an input circuit 26 (further discussed below) for receiving varying, fluctuating, or oscillating electrical current. Typically, the varying current would induce the primary magnetic field in the transformer core 12, and variation of the primary magnetic field would excite current in the secondary winding 16. However, saturation of the transformer core 12 by the permanent magnetic field 24 of the first polarity prevents the primary winding 14 from inducing in the transformer core a primary magnetic field 20 that matches the first polarity of the permanent magnetic field. Additionally, saturation of the transformer core 12 prevents the primary winding 14 from inducing in the transformer core a primary magnetic field 20 of a second polarity opposing the permanent magnetic field, unless the primary magnetic field is sufficiently strong to de-saturate the transformer core.

Thus, appropriate specification of the input circuit 26 and of the permanent magnet 18, according to embodiments of the present invention, can ensure that the default state of the magnetically biased power supply 10 is to not transfer electrical power from the primary winding 14 to the secondary winding 16. Instead, in order for power transfer to happen, the transformer core 12 must first be de-saturated by some other means. Accordingly, at least one bias winding is provided for temporarily de-saturating the transformer core to establish a permissive state for power transfer.

In the embodiment shown in FIG. 1, two bias windings are provided: a start-up bias winding 28, and a feedback bias winding 30. When a current is provided through either of these bias windings, the current produces a bias magnetic field 32 of a second polarity opposing the permanent magnetic field in the transformer core 12. When a sufficient voltage ("bias voltage") is provided across one of the bias windings, the current through the winding produces a bias magnetic field that is sufficiently strong to overcome the permanent magnetic field and to thereby de-saturate the transformer core 12.

The start-up bias winding 28 is connected to start-up terminals 34 for receiving bias voltage from an external source. The start-up bias winding 28 is electrically isolated from the primary winding 14. Thus, when power is first available at the primary winding 14, the power supply 10 will not transfer power to the secondary winding 16 until bias voltage is applied to the start-up bias winding 28 from the external source. Once bias voltage is applied to the start-up bias winding 28, then the transformer core 12 becomes de-saturated so that the primary winding 14 can transfer power to the secondary winding 16.

The feedback bias winding 30 is electrically connected with the load terminals 22 of the secondary winding 16. Thus, while power is being transferred through the de-saturated transformer core 12 to the secondary winding 16, the feedback bias winding 30 receives bias voltage to maintain the bias magnetic field and to keep the transformer core de-saturated.

Typically, the primary winding 14 is connected to receive electrical power from the input circuit 26. An exemplary input circuit 26, as shown in FIG. 1, includes a source terminal 36 and a ground terminal 38, between which the primary winding 14 is connected in series with one or more diodes 40, a primary oscillator circuit 42, and multiple control points 44.

The diodes 40 are provided so that current through the primary winding 14 is limited to producing a primary magnetic field of the first polarity matching the permanent magnetic field. The primary oscillator circuit 42 is provided to cyclically vary the primary winding current, thereby changing the primary magnetic field for excitation of the transformer core 12.

Each of the control points 44 is normally open but is actuated closed by an "enable" signal provided from a fail-safe circuit (not shown). The fail-safe circuit establishes and maintains the "enable" signals based on monitoring static and dynamic values of electrical parameters within the input circuit 26 and/or within a load connected to the load terminals 22. Each control point 44 has an associated feedback circuit 46 that normally sends an "ok" signal to the fail-safe circuit while the control point is closed. The control points 44 can be arranged at least partly in parallel, as shown in FIG. 1, so that it is possible to test open one or more of the control points (for example, by temporarily dropping one or more of the "enable" signals) without loss of power to the primary winding 14. However, this arrangement requires that more than one control point needs to open in order to secure power from the primary winding 14. Alternatively the control points 44 can all be arranged in series.

In case a control point 44 fails to open for a test condition, or in case an "ok" signal ceases outside of a test condition, then the fail-safe circuit discontinues all of the "enable" signals, thereby opening all of the control points 44 to remove electrical power from the primary winding 14. This is the establishment of a "safe state."

Once the safe state has been established, the secondary winding 16 ceases to be excited from the transformer core 12. Therefore, bias voltage is removed from the feedback bias winding 30, so that the transformer core 12 again becomes saturated by the permanent magnet 18. Thus, until bias voltage is supplied to the start-up bias winding 28 from the external source, it will not be possible to transfer power from the primary winding 14 to the secondary winding 16. This is "safe state retention." Advantageously, in aspects of the invention, safe state establishment and retention can be demonstrated without incurring undue expense for restoration from the safe state to an operational state.

Figure 2:
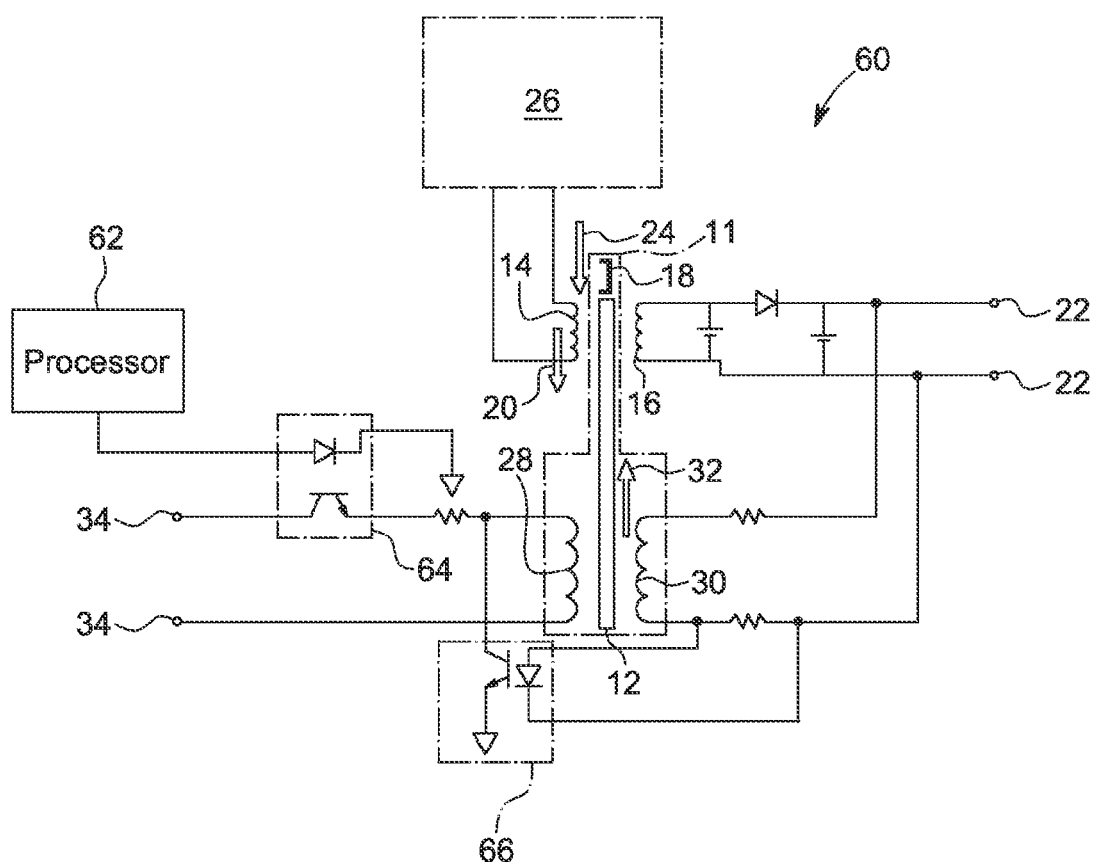
FIG. 2 illustrates an electronic schematic of a magnetically biased power supply with safe state retention, according to a second exemplary embodiment of the invention.

FIG. 2 shows a second exemplary embodiment of the invention, wherein a magnetically biased power supply 60 is generally similar to the power supply 10 as shown in FIG. 1. However, in this embodiment, the start-up bias winding 28 is not supplied with bias voltage directly from the start-up terminals 34. Instead, a processor 62 controls a switch 64 to gate the external bias voltage. The processor 62 is programmed to enable the switch 64, only after pre-determined start-up conditions are established. In embodiments, these start-up conditions include receiving key data that matches encoded information or a generated code. For example, the processor 62 may be encoded with information specific to the power supply 60. Alternatively, the processor 62 may be programmed to generate a time-based sequential code. The key data can be supplied to the processor 62 by a signal applied at the start-up terminals 34. The matching key data is available only to authorized maintenance/repair personnel. Thus, the power supply 60 can be reset from a safe state only under controlled start-up conditions. Advantageously, this reduces opportunities for operator error (e.g., re-start outside design conditions). As another means for preventing unintended re-start, or at least for enhancing control of re-start, a keyed switch (similar to the switch 102 as shown in FIG. 10), a button, a handle, or similar mechanical means may be substituted for the processor-controlled switch 64. Nonetheless, a device requiring at least some level of authorization (e.g., a pass code or a key) is advantageous for decreasing risk of operator error.

Additionally, FIG. 2 shows the feedback bias winding 30 connected in series with a cut-out circuit 66 that de-energizes the start-up bias winding 28 while the feedback bias winding 30 is energized. Thus, only one of the start-up bias winding 28 or the feedback bias winding 30 will be providing a bias magnetic field. Depending on specifications of the windings and of the permanent magnet, as well as other power supply components, the cut-out circuit may be useful for preventing reverse saturation of the transformer core 12, in other words, saturation of the transformer core by the bias magnetic field 32. Although the cut-out circuit 66 is shown separate from the processor 62, it can equally be integrated as a function of the processor controlling the switch 64. Alternatively, the processor 62 can be configured to provide an operator alert that indicates the feedback bias winding 30 is energized. Then an operator can be relied upon to de-energize the start-up bias winding 28 as part of a start-up procedure. As another alternative, the start-up and feedback bias windings can be specified so that the transformer core 12 will assuredly be saturated by simultaneous energization of both windings.

The processor 62 could be powered from the start-up terminals 34. Alternatively, given adequate isolation from the start-up bias winding 28 (e.g., by an opto-isolator built into the switch 64, as shown in FIG. 2), the processor could be powered from the input circuit 26.

Figure 3:
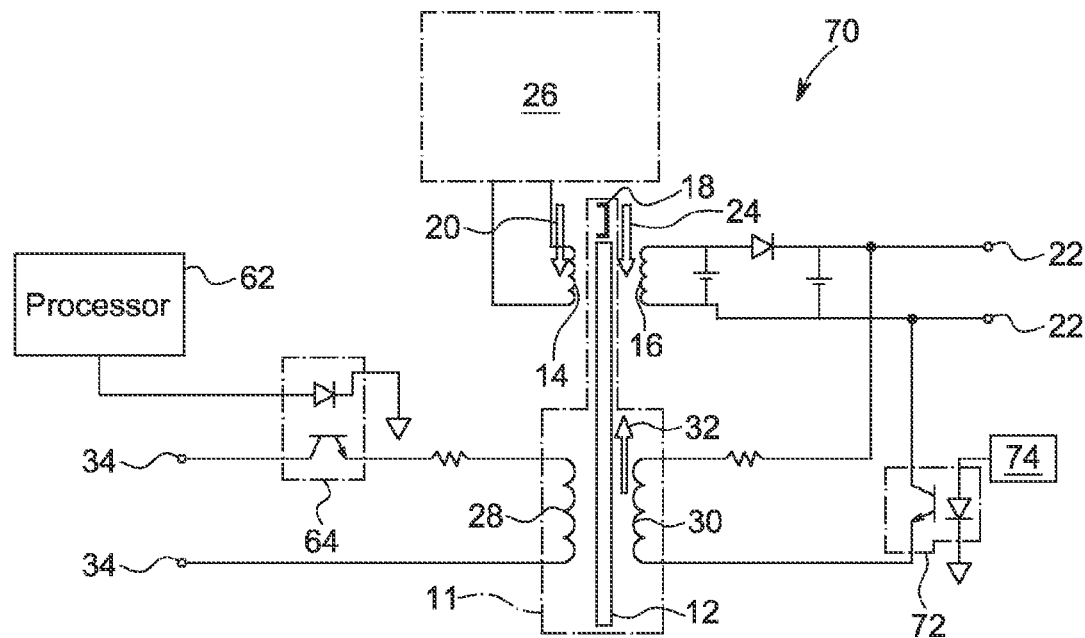
FIG. 3 illustrates an electronic schematic of a magnetically biased power supply with safe state retention, according to a third exemplary embodiment of the invention.

FIG. 3 shows a third illustrative embodiment of the invention, in which a magnetically biased power supply 70 is generally similar to the power supplies 10 and 60. However, in this embodiment, the feedback bias winding 30 is connected in series with a vital switch 72 that receives gate voltage from a fault detect circuit 74. The fault detect circuit 74 is configured to supply gate voltage to the vital switch 72 from the secondary winding 16, so long as electrical parameters at the load terminals 22 remain within pre-determined ranges. Thus, in case a load connected to the load terminals 22 exceeds its design envelope, the fault detect circuit 74 will discontinue bias voltage to the feedback bias winding 30, thereby saturating the transformer core 12 and establishing a safe state. Advantageously, fault detection for the secondary circuit can thereby be electrically isolated from fault detection for the primary circuit.

Figure 4:
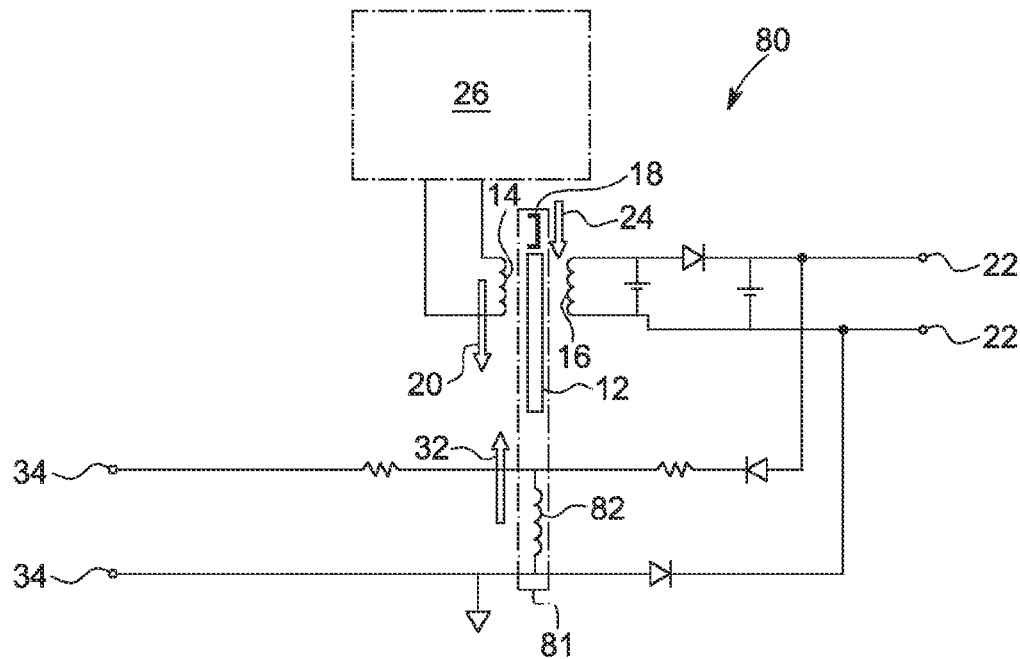
FIG. 4 illustrates an electronic schematic of a magnetically biased power supply with safe state retention, according to a fourth exemplary embodiment of the invention.

FIG. 4 shows a fourth exemplary embodiment of the invention, in which a magnetically biased power supply 80 is generally similar to the power supplies 10, 60, and 70. However, in this embodiment, a second reversibly saturated transformer core apparatus 81 includes a single bias winding 82 in place of separate start-up and feedback bias winding means for removing the permanent magnetic field 20 from the transformer core 12. The single bias winding 82 is connected to receive electrical power from either the start-up terminals 34 or the secondary winding 16. The bias winding 82 is connected so that the start-up terminals 34 cannot supply electrical power to the load terminals 22. Advantageously, the magnetically biased power supply 80 requires only three windings and thereby can be manufactured at somewhat lower cost than the first three exemplary embodiments.

Figure 5:
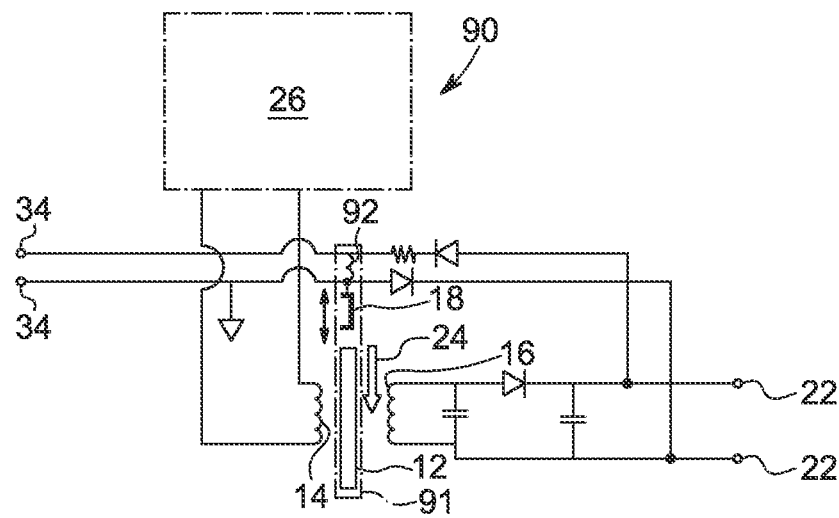
FIG. 5 illustrates an electromechanical schematic of a magnetically biased power supply with safe state retention, according to a fifth exemplary embodiment of the invention.

FIG. 5 shows a fifth exemplary embodiment of the invention, in which a magnetically biased power supply 90 is generally similar to the power supply 80 shown in FIG. 4. However, in this embodiment, a third reversibly saturated transformer core apparatus 91 includes a single bias winding that is arranged to operate as a solenoid 92 for removing the permanent magnetic field 24 from the transformer core 12 by retracting the permanent magnet 18 from its first, safe state position to a second, operating position where the transformer core is not saturated. The solenoid 92 may be linear or rotary, or any equivalent electrical means, with gravity or a spring providing for return of the permanent magnet 18 from its operating position to its default safe state position for re-saturating the transformer core 12. Gravity return may, in some embodiments, be spring-assisted for additional safe state assurance. Thus, immediately on removing power from the solenoid 92, the permanent magnet 18 drops back or otherwise moves back to its safe state position adjacent the transformer core 12. A safe state of transformer core saturation is re-established and can be retained until bias current is again supplied to the solenoid 92 from the start-up terminals 34. Advantageously, holding current of the solenoid 92 can be less than the bias current required for providing a bias field 32 through a bias winding of the same turns.

Figure 6:
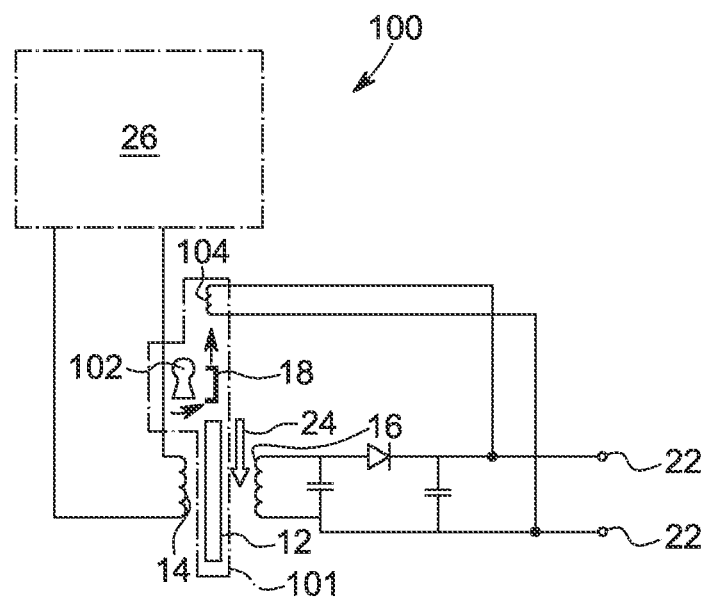
FIG. 6 illustrates an electromechanical schematic of a magnetically biased power supply with safe state retention, according to a sixth exemplary embodiment of the invention.

FIG. 6 shows a sixth exemplary embodiment of the invention, in which a magnetically biased power supply 100 is generally similar to the power supply 90 shown in FIG. 5. However, in this embodiment, no start-up terminals are included. Instead of supplying an external current to operate electrical means for removing the permanent magnetic field 24 from the transformer core 12, a fourth reversibly saturated transformer core apparatus 101 includes a spring-return key switch 102, which is operable to rotate or raise the permanent magnet 18 away from the transformer core 12 to an operating position, where the permanent magnetic field 20 is removed from the transformer core. In place of the illustrative key switch 102, a handle, lever, plunger, button, or equivalent mechanical means may be used for removing the permanent magnetic field 24 from the transformer core 12.

In order to keep the permanent magnet 18 away from the transformer core 12, the key switch 102 must be used to hold the permanent magnet 18 in the operating position until current is supplied through a latch solenoid 104 from the secondary winding 16. Once the latch solenoid 104 is energized, it holds the permanent magnet 18 away from the transformer core 12. The key switch 102 then can be released to permit return of the permanent magnet 18 to its default safe state position. Then, on removal of current from the latch solenoid 104, the permanent magnet 18 immediately drops back to its safe state position, thereby re-saturating the transformer core 12. Thus, a safe state is retained from the time when the latch solenoid 104 is deactivated, until the key switch 102 is again actuated while power is supplied to the primary winding 14. Advantageously, the magnetically biased power supply 100 can be designed to require minimal current draw through the latch solenoid 104 for maintaining an operational condition.

As will be readily appreciated, in aspects of the present invention, a transformer core is saturated with a permanent magnetic field, which can be temporarily canceled or removed by supplying current to a bias winding. While the bias winding provides a bias magnetic field for temporarily canceling or removing the permanent magnetic field to de-saturate the transformer core, it is possible to excite the transformer core with a primary magnetic field from a primary winding, thereby transferring power from the primary winding to a secondary winding excited by the transformer core. As a result, it is possible to provide a magnetically biased power supply in which the default (safe) state is to not transfer power from the primary winding to the secondary winding.

In embodiments, a magnetically biased power supply apparatus includes a transformer core, a primary winding, a secondary winding, a permanent magnet, and a bias winding. The primary winding is arranged to supply, when energized, a varying primary magnetic field for exciting the transformer core. The secondary winding is electrically isolated from the primary winding and is arranged to be energized by the varying primary magnetic field in the transformer core. The permanent magnet is arranged in a safe state position to prevent excitation of the transformer core by saturating the transformer core with a permanent magnetic field. The bias winding is connected to receive current from the secondary winding and is arranged to supply, while energized, a bias magnetic field for preventing saturation of the transformer core by the permanent magnetic field. Thus, loss of current from the secondary winding to the bias winding will cause restoration of the permanent magnetic field to saturate the transformer core.

In some embodiments, the bias winding is configured to establish a magnetic field canceling the permanent magnetic field. In select embodiments, the bias winding also is connected to receive current from an external source. Some such embodiments may include a circuit for preventing the bias winding receiving current from the external source while the secondary winding is energized. Other embodiments include a start-up winding connected to receive current from an external source and arranged to supply, while energized, a start-up magnetic field for preventing saturation of the transformer core by the permanent magnetic field. Such embodiments may also include a circuit for de-energizing the start-up winding while the bias winding is energized. In select embodiments, the start-up winding is configured to establish a magnetic field canceling the permanent magnetic field, and the bias winding is configured to establish another magnetic field canceling the permanent magnetic field, such that simultaneous energization of the start-up winding and of the bias winding will saturate the transformer core with a combined magnetic field opposite the permanent magnetic field. In other embodiments, the bias winding supplies the bias magnetic field for moving the permanent magnet from the safe state position to an operating position where the transformer core is not saturated by the permanent magnetic field, and the permanent magnet is configured to return from the operating position to the safe state position on loss of current to the bias winding. Yet other embodiments include mechanical means for moving the permanent magnet from the safe state position to an operating position where the transformer core is not saturated by the permanent magnetic field. In such embodiments, the bias winding supplies the bias magnetic field for holding the permanent magnet in the operating position, and the permanent magnet is configured to return from the operating position to the safe state position on loss of current to the bias winding.

In aspects, a varying magnetic field in a transformer core induces a current in a secondary winding that is part of, and powers, a secondary circuit. On detection of a fault condition in the secondary circuit, a permanent magnetic field is permitted to saturate the transformer core, thereby preventing variation of the magnetic field in the transformer core. On satisfaction of a start-up condition, the permanent magnetic field is removed to permit variation of the magnetic field in the transformer core. In some aspects, removing the permanent magnetic field includes supplying current to a bias winding. Supplying current to the bias winding may induce a bias magnetic field opposing the permanent magnetic field. For example, the bias magnetic field may cancel the permanent magnetic field. Thus, the permanent magnetic field is permitted to saturate the transformer core, when current is removed from the bias winding. In other aspects, supplying current to the bias winding affects the position of a permanent magnet. Removing the permanent magnetic field includes repositioning the permanent magnet away from the transformer core. Permitting the permanent magnetic field to saturate the transformer core, includes permitting the permanent magnet to approach the transformer core.

In embodiments, a reversibly saturated transformer core apparatus includes a body of highly magnetically permeable material, a permanent magnet that is arranged in a safe state position for saturating the body with a permanent magnetic field, and means for removing the permanent magnetic field from the body. In some embodiments, the means for removing the permanent magnetic field include a bias winding connected to receive current from the secondary winding and arranged to supply, while energized, a bias magnetic field for maintaining the permanent magnetic field removed from the core. In certain embodiments, the means for removing the permanent magnetic field include means for moving the permanent magnet to an operating position. The means for moving the permanent magnet may include a key switch or equivalent mechanical means requiring operator intervention. In some such embodiments, the permanent magnet is configured to return from the operating position to the safe state position, and the bias magnetic field maintains the permanent magnet in the operating position. In other embodiments, the means for removing the permanent magnetic field include a start-up winding that is configured to, when energized, provide a start-up magnetic field that cancels the permanent magnetic field. In some such embodiments, the bias magnetic field also cancels the permanent magnetic field. For example, the start-up winding may be connected to start-up terminals via a processor-controlled switch, and the start-up winding can be energized from the start-up terminals only after entry of a pass code to enable the processor-controlled switch. In some embodiments, the means for removing the permanent magnetic field include start-up terminals connected with the bias winding via a switch, and the means for removing the permanent magnetic field are operable by application of an external voltage across the start-up terminals in combination with authorized operation of the switch.

In another embodiment, a power supply apparatus comprises a transformer core, a primary winding operably coupled with the transformer core, a secondary winding operably coupled with the transformer core, a permanent magnet, and a bias winding. The permanent magnet is configured, in a first mode of operation of the power supply apparatus, to supply a permanent magnetic field that saturates the transformer core for preventing power transfer between the primary winding and the secondary winding. The bias winding is configured, in a second mode of operation of the power supply apparatus, to receive a current for generating a second magnetic field to prevent saturation of the transformer core by the permanent magnetic field and thereby allow the power transfer. (According to another aspect, when the bias winding ceases receiving the current, the permanent magnetic field again saturates the transformer core for preventing the power transfer.)

In operation in the first mode of operation of the power supply apparatus, the permanent magnet supplies the permanent magnetic field that saturates the transformer core for preventing power transfer between the primary winding and the secondary winding. In operation in the second mode of operation of the power supply apparatus, the bias winding receives the current, and responsive to the current, generates the second magnetic field, which prevents saturation of the transformer core by the permanent magnetic field, thereby allowing the power transfer. In embodiments, termination of the current, that is, when the bias winding no longer receives the current, results in a transition back to the first mode of operation. In the second mode, the power supply apparatus may be configured for the bias winding to generate the second magnetic field to counteract the permanent magnetic field, or the second magnetic field may cause the permanent magnet to move from a first position where the permanent magnetic field saturates the transformer core to a second position where the permanent magnetic field does not saturate the transformer core, due to the permanent magnet being positioned farther away from the transformer core in the second position than the first position.

In another embodiment, a method comprises saturating a core of a transformer with a permanent magnetic field to prevent power transfer by the transformer. The method further comprises selectively generating a second magnetic field to cease the saturating of the core of the transformer with the permanent magnetic field.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §92, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described magnetically biased power supply and method for safe state retention, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A power supply apparatus comprising:
   a transformer core;

a primary winding arranged to supply, while energized, a varying primary magnetic field for exciting the transformer core;

a secondary winding electrically isolated from the primary winding and arranged to be energized by the varying primary magnetic field in the transformer core;

a permanent magnet arranged in a first position to prevent excitation of the transformer core by saturating the transformer core with a permanent magnetic field; and a bias winding connected to receive current from the secondary winding and arranged to supply, while energized, a bias magnetic field for preventing saturation of the transformer core by the permanent magnetic field;

wherein discontinuation of current from the secondary winding to the bias winding will cause restoration of the permanent magnetic field to saturate the transformer core.

2. An apparatus as claimed in claim 1, wherein the bias winding also is connected to receive current from an external source.

3. An apparatus as claimed in claim 2, further comprising a circuit for preventing the bias winding from receiving the current from the external source while the secondary winding is energized.

4. An apparatus as claimed in claim 1, further comprising a start-up winding connected to receive current from an external source and arranged to supply, while energized, a start-up magnetic field for preventing saturation of the transformer core by the permanent magnetic field.

5. An apparatus as claimed in claim 4, further comprising a circuit for de-energizing the start-up winding while the bias winding is energized.

6. An apparatus as claimed in claim 4, wherein the start-up winding is configured for the start-up magnetic field to cancel the permanent magnetic field, and the bias winding is configured for the bias magnetic field to cancel the permanent magnetic field, such that simultaneous energization of the start-up winding and of the bias winding will saturate the transformer core with a combined magnetic field opposite the permanent magnetic field.

7. An apparatus as claimed in claim 1, wherein the bias winding is configured for the bias magnetic field to cancel the permanent magnetic field.

8. An apparatus as claimed in claim 1, wherein the bias winding is operative to supply the bias magnetic field for moving the permanent magnet from the first position to a second position where the transformer core is not saturated by the permanent magnetic field, and wherein the permanent magnet is configured to return from the second position to the first position on loss of current to the bias winding.

9. An apparatus as claimed in claim 1, further comprising means for moving the permanent magnet from the first position to a second position where the transformer core is not saturated by the permanent magnetic field, wherein the bias winding is operative to supply the bias magnetic field for holding the permanent magnet in the second position, and wherein the permanent magnet is configured to return from the second position to the first position on loss of current to the bias winding.

10. A transformer core apparatus comprising:
a body of highly magnetically permeable material;
a permanent magnet arranged in a first position for saturating the body with a permanent magnetic field; and
a bias winding for removing the permanent magnetic field from the body, the bias winding connected to receive current from a secondary winding operably coupled with the body and the bias winding arranged to supply, while energized, a bias magnetic field for maintaining the permanent magnetic field removed from the body.

11. A transformer core apparatus comprising:
a body of highly magnetically permeable material;
a permanent magnet arranged in a first position for saturating the body with a permanent magnetic field; and
a key switch configured to remove the permanent magnetic field from the body by moving the permanent magnet from the first position to a second position where the permanent magnetic field does not saturate the body.

12. A transformer core apparatus comprising:
a body of highly magnetically permeable material;
a permanent magnet arranged in a first position for saturating the body with a permanent magnetic field; and
means for removing the permanent magnetic field from the body;
wherein the means for removing the permanent magnetic field include means for moving the permanent magnet from the first position to a second position where the permanent magnetic field does not saturate the body; and
wherein the permanent magnet is configured to return from the second position to the first position, and the means for removing the permanent magnetic field include a bias winding connected to receive current from a secondary winding operably coupled with the body and the bias winding arranged to supply, while energized, a bias magnetic field that maintains the permanent magnet in the second position.

13. A transformer core apparatus comprising:
a body of highly magnetically permeable material;
a permanent magnet arranged in a first position for saturating the body with a permanent magnetic field; and
a start-up winding that is configured to, when energized, provide a start-up magnetic field that cancels the permanent magnetic field.

14. An apparatus as claimed in claim 13, further comprising a bias winding connected to receive current from a secondary winding operably coupled with the body and the bias winding arranged to supply, while energized, a bias magnetic field that cancels the permanent magnetic field.

15. An apparatus as claimed in claim 13, wherein the start-up winding is connected to start-up terminals via a processor-controlled switch, and the start-up winding can be energized from the start-up terminals only after entry of a pass code to enable the processor-controlled switch.

16. A transformer core apparatus comprising:
a body of highly magnetically permeable material;
a permanent magnet arranged in a first position for saturating the body with a permanent magnetic field; and
means for removing the permanent magnetic field from the body, wherein the means for removing the permanent magnetic field include start-up terminals connected via a switch with the means for removing the permanent magnetic field, said means for removing the permanent magnetic field being operable by application of an external voltage across the start-up terminals in combination with authorized operation of the switch.

17. A power supply apparatus comprising:
a transformer core, a primary winding operably coupled with the transformer core, a secondary winding operably coupled with the transformer core, a permanent magnet, and a bias winding;
wherein the permanent magnet is configured, in a first mode of operation of the power supply apparatus, to supply a permanent magnetic field that saturates the transformer core for preventing power transfer between the primary winding and the secondary winding; and wherein the bias winding is configured, in a second mode of operation of the power supply apparatus, to receive a current for generating a second magnetic field to prevent saturation of the transformer core by the permanent magnetic field and thereby allow the power transfer.

18. A transformer core apparatus comprising:

a body of highly magnetically permeable material;

a permanent magnet arranged in a first position for saturating the body with a permanent magnetic field; and electrical means for electrically removing the permanent magnetic field from the body.

19. An apparatus as claimed in claim 18, further comprising:

a primary winding arranged to supply, while energized, a varying primary magnetic field for exciting the body; and a secondary winding electrically isolated from the primary winding and arranged to be energized by the varying primary magnetic field in the body for delivering electrical power to a load.

20. A transformer core apparatus comprising:

a body of highly magnetically permeable material;

a primary winding arranged to supply, while energized, a varying primary magnetic field for exciting the body;

a secondary winding electrically isolated from the primary winding and arranged to be energized by the varying primary magnetic field in the body for delivering electrical power to a load;

a permanent magnet arranged in a first position for saturating the body with a permanent magnetic field; and means for removing the permanent magnetic field from the body.

* * * * *